(12) United States Patent
Zhu et al.

(10) Patent No.: US 12,281,859 B2
(45) Date of Patent: Apr. 22, 2025

(54) WASTE HEAT UTILIZATION SYSTEM OF IMMERSED LIQUID COOLING HEAT DISSIPATION DEVICE

(71) Applicant: CANAAN CREATIVE CO., LTD., Beijing (CN)

(72) Inventors: Huanlai Zhu, Beijing (CN); Nangeng Zhang, Beijing (CN)

(73) Assignee: CANAAN CREATIVE CO., LTD., Beijing (CN)

( * ) Notice: Subject to any disclaimer, the term of this patent is extended or adjusted under 35 U.S.C. 154(b) by 97 days.

(21) Appl. No.: 18/005,346

(22) PCT Filed: Jul. 8, 2021

(86) PCT No.: PCT/CN2021/105243
§ 371 (c)(1),
(2) Date: Jan. 12, 2023

(87) PCT Pub. No.: WO2022/012408
PCT Pub. Date: Jan. 20, 2022

(65) Prior Publication Data
US 2023/0266068 A1    Aug. 24, 2023

(30) Foreign Application Priority Data
Jul. 14, 2020    (CN) .......................... 202021377125.3

(51) Int. Cl.
*F28D 7/02*        (2006.01)
*F28D 9/00*        (2006.01)
(Continued)

(52) U.S. Cl.
CPC .......... *F28D 9/0093* (2013.01); *F28D 9/0081* (2013.01); *F28D 7/0025* (2013.01); *F28F 1/10* (2013.01)

(58) Field of Classification Search
CPC .... F28D 9/0093; F28D 9/0081; F28D 7/0025; F28F 1/10
(Continued)

(56) References Cited

U.S. PATENT DOCUMENTS

2015/0280099 A1*  10/2015  Boukai ................. H10N 10/01
                                                                       438/54

FOREIGN PATENT DOCUMENTS

CN        105468117 A     4/2016
CN        105607715 A     5/2016
(Continued)

OTHER PUBLICATIONS

International Search Report mailed Sep. 2, 2021 in PCT Application No. PCT/CN2021/105243.

*Primary Examiner* — Davis D Hwu
(74) *Attorney, Agent, or Firm* — Sheppard Mullin Richter & Hampton LLP

(57) ABSTRACT

A waste heat utilization system of an immersed liquid cooling heat dissipation device. The immersed liquid cooling heat dissipation device (100) comprises a liquid cooling tank (110). The liquid cooling tank (110) comprises an oil tank inlet (111) and an oil tank outlet (112). The system further comprises a waste heat utilization device (200). The waste heat utilization device (200) comprises a waste heat utilization body (210), a cold oil outlet (220) and a hot oil inlet (230), the cold oil outlet (220) and the hot oil inlet (230) being connected to the waste heat utilization body (210); the cold oil outlet (220) is connected with the oil tank inlet (111); the hot oil inlet (230) is connected to the oil tank outlet (112); the waste heat utilization body (210) is connected to a heat utilization end (300).

10 Claims, 3 Drawing Sheets

(51) Int. Cl.
  *F28D 7/00* (2006.01)
  *F28F 1/10* (2006.01)
(58) Field of Classification Search
  USPC .......................................................... 165/164
  See application file for complete search history.

(56) References Cited

FOREIGN PATENT DOCUMENTS

| | | | |
|---|---|---|---|
| CN | 106765760 | A | 5/2017 |
| CN | 108089679 | A | 5/2018 |
| CN | 110345549 | A | 10/2019 |
| KR | 102127188 | B1 | 6/2020 |

\* cited by examiner

WASTE HEAT UTILIZATION SYSTEM OF IMMERSED LIQUID COOLING HEAT DISSIPATION DEVICE

CROSS REFERENCE TO RELATED APPLICATIONS

This application is a U.S. National Stage Application of International Application No. PCT/CN2021/105243, filed on Jul. 8, 2021, and titled "WASTE HEAT UTILIZATION SYSTEM OF IMMERSED LIQUID COOLING HEAT DISSIPATION DEVICE," which is based on and claims priority to and benefits of Chinese Patent Application No. 202021377125.3, filed with the China National Intellectual Property Administration (CNIPA) on Jul. 14, 2020. The contents of the prior applications are hereby incorporated by reference in their entirety.

TECHNICAL FIELD

The present invention relates to a technical field of liquid cooling heat dissipation, in particular a waste heat utilization system of an immersed liquid cooling heat dissipation device.

BACKGROUND

A computing device is an electronic device used for high-speed computing, such as a blockchain server used to run a specific algorithm and communicate with a remote server to obtain a corresponding virtual currency. The progress of existing industries has promoted the evolution of various computing devices to be cooled, including blockchain servers, towards automation and intelligence, and the optimization of computing device performance requires the support by more and more computing chips. The use of a large number of computing chips will inevitably greatly increase the heat dissipation. Existing blockchain servers often use forced air cooling, but with the increase in heat dissipation density, air cooling is gradually difficult to meet the heat dissipation requirements. The liquid cooling heat dissipation method with higher heat dissipation efficiency is one of the options in the future, and how to properly utilize thermal energy while performing liquid cooling heat dissipation, is a technical problem to be solved by those skilled in the art.

SUMMARY

The object of the present invention is to provide a waste heat utilization system of an immersed liquid cooling heat dissipation device, which could effectively utilize waste heat while improving heat dissipation efficiency.

In order to achieve the above object, the present invention proposes a waste heat utilization system of an immersed liquid cooling heat dissipation device, wherein the immersed liquid cooling heat dissipation device comprises a liquid cooling tank, and the liquid cooling tank comprises an oil tank inlet and an oil tank outlet, the waste heat utilization system further comprises a waste heat utilization device, wherein the waste heat utilization device comprises a waste heat utilization body and a cold oil outlet and a hot oil inlet connected to the waste heat utilization body, the cold oil outlet being connected to the oil tank inlet, the hot oil inlet being connected to the oil tank outlet, and the waste heat utilization body being connected with a heat utilization end.

In an embodiment of the above waste heat utilization system of the immersed liquid cooling heat dissipation device, the waste heat utilization device comprises a heat dissipation side circulation line and a utilization side circulation line, wherein the heat dissipation side circulation line is connected to the liquid cooling tank, and the utilization side circulation line is connected to the heat utilization end.

In an embodiment of the above waste heat utilization system of the immersed liquid cooling heat dissipation device, the waste heat utilization body is a plate heat exchanger.

In an embodiment of the above waste heat utilization system of the immersed liquid cooling heat dissipation device, a cooling medium of the heat dissipation side circulation line is a cooling oil, and a cooling medium of the utilization side circulation line is cooling water.

In an embodiment of the above waste heat utilization system of the immersed liquid cooling heat dissipation device, the waste heat utilization body is a finned tube heat exchanger.

In an embodiment of the above waste heat utilization system of the immersed liquid cooling heat dissipation device, a cooling medium of the heat dissipation side circulation line is a cooling oil, and a cooling medium of the utilization side circulation line is air.

In an embodiment of the above waste heat utilization system of the immersed liquid cooling heat dissipation device, the waste heat utilization device comprises a circulation line, and the heat utilization end is connected in the circulation line.

In an embodiment of the above waste heat utilization system of the immersed liquid cooling heat dissipation device, the liquid cooling tank comprises a first device tank compartment, a second device tank compartment and a return tank compartment, and the return tank compartment is located between the first device tank compartment and the second device tank compartment.

In an embodiment of the above waste heat utilization system of the immersed liquid cooling heat dissipation device, the oil tank inlet is connected to the first device tank compartment and the second device tank compartment, the oil tank outlet is connected to the return tank compartment, and the oil tank inlet is lower than a computing device to be cooled in the first device tank compartment and the second device tank compartment.

In an embodiment of the above waste heat utilization system of the immersed liquid cooling heat dissipation device, the liquid cooling tank further comprises a plurality of return oil ports, and the return oil ports are disposed on wall surfaces between the first device tank compartment and the return tank compartment, and between the second device tank compartment and the return tank compartment.

The beneficial effect of the present invention is that, the waste heat utilization system of the immersed liquid cooling heat dissipation device of the present invention not only could achieve high heat dissipation efficiency and utilize waste heat at the same time, but also avoids waste of the waste heat.

The present invention will be described in detail below in conjunction with the accompanying drawings and specific embodiments, but not as a limitation of the present invention.

Figure 1:
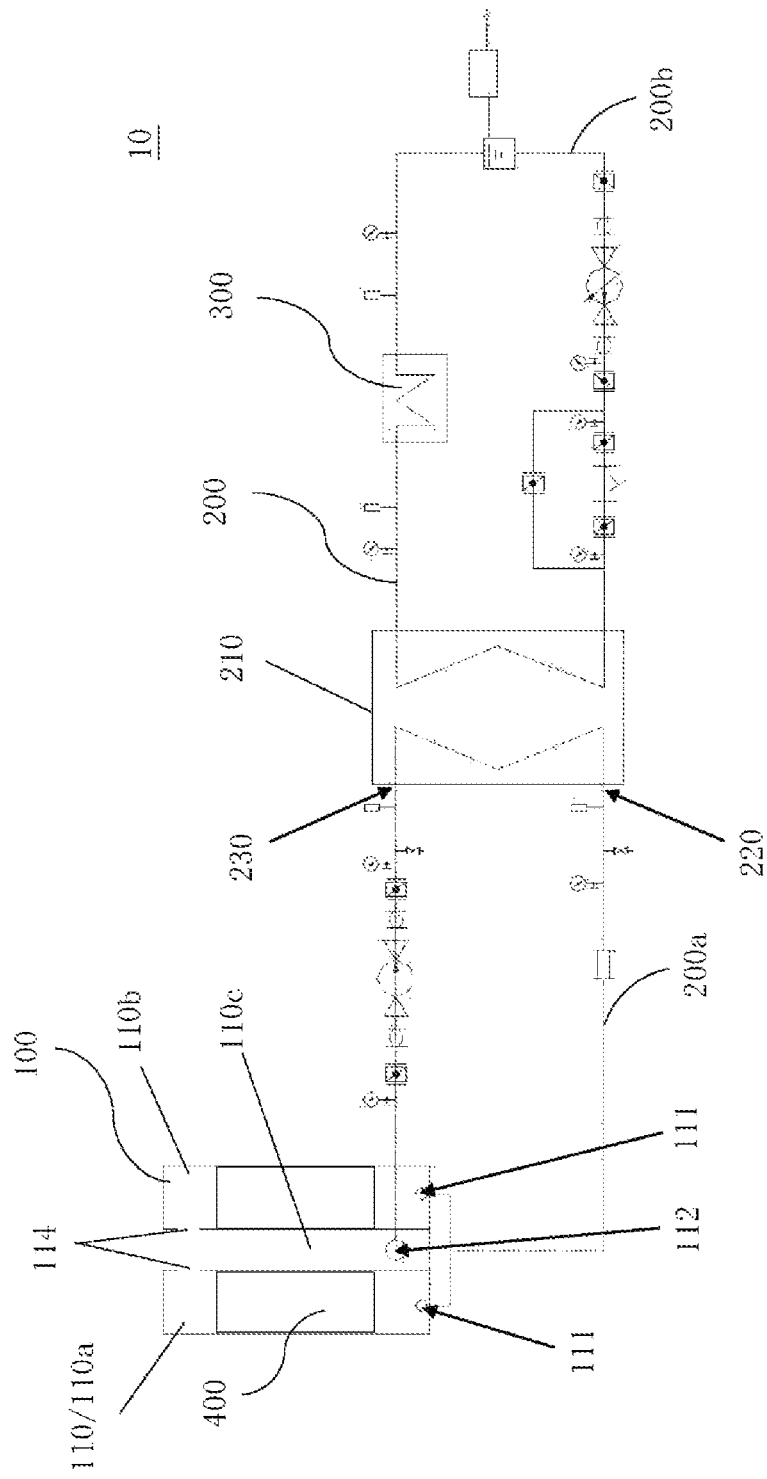
FIG. 1 is a structural schematic diagram (1) of an embodiment of the waste heat utilization system of the immersed liquid cooling heat dissipation device of the present invention.

In the figures, reference numbers are as follows:
100: immersed liquid cooling heat dissipation device
110: liquid cooling tank
110a: first device tank compartment
110b: second device tank compartment
110c: return tank compartment
111: oil tank inlet
112: oil tank outlet
114: return oil port
200, 200', 210": waste heat utilization device
200a, 200a': heat dissipation side circulation line
200b, 200b': utilization side circulation line
200c": circulation line
210, 210', 210": waste heat utilization body
220, 220', 220": cold oil outlet
230, 230', 230": hot oil inlet
300: heat utilization end
400: computing device

DETAILED DESCRIPTION

The technical solution of the present invention will be described in detail below in conjunction with the accompanying drawings and specific embodiments to further understand the objectives, solutions and effects of the present invention, but it is not intended to limit the scope of the appended claims of the present invention.

References in the specification to "an embodiment", "another embodiment", "present embodiment" and the like mean that the described embodiment may comprise specific features, structures or characteristics, but not every embodiment has to comprise these specific features, structures or characteristics. Furthermore, such expressions are not meant to the same embodiment. Furthermore, when specific features, structures or characteristics are described in conjunction with an embodiment, whether or not there is an explicit description, it has been indicated that it is within the knowledge of those skilled in the art to combine such features, structures or characteristics into other embodiments.

Certain terms are used in the description and the following claims to refer to specific components or parts, and those skilled in the art should understand that users or manufacturers of the technology may refer to the same components or parts with different designations or terms. This description and the following claims do not distinguish components or parts with differences in the manner they are termed, but distinguish the components or parts with differences in functionalities thereof as a distinguishing criterion. "Comprise" and "include" mentioned in the entire specification and following claims are open-ended terms, so they should be interpreted as "include but not limited to." In addition, the word "connect" comprises herein any means for direct and indirect connection.

It should be noted that, in the description of the present invention, in the case where orientations or positional relationships indicated by terms such as "latitudinal", "longitudinal", "upper", "lower", "front", "rear", "left", "right", "vertical", "horizontal", "top", "bottom", "inner" and "outer" occur, they are based on the orientations or positional relationships shown in the drawings, and are only for the convenience of describing the present invention and simplifying the description. They do not indicate or imply that the devices or elements referred to must have a specific orientation, be constructed and operated in a specific orientation, and thus should not be construed as limiting the invention. For the sake of clarity, the sequential terms such as "first", "second", "third" and "fourth" mentioned herein are used to distinguish an element, region, or part from another same or similar element, region, part, rather than used to limit specific elements, regions, and parts.

As shown in FIG. 1, FIG. 1 is a structural schematic view of an embodiment of a waste heat utilization system of an immersed liquid cooling heat dissipation device of the present invention. The waste heat utilization system 10 of the immersed liquid cooling heat dissipation device of the present invention is used for utilizing heat dissipated by the immersed liquid cooling heat dissipation device 100 as waste heat.

Wherein, the immersed liquid cooling heat dissipation device 100 comprises a liquid cooling tank 110, and the liquid cooling tank 110 comprises an oil tank inlet 111 and an oil tank outlet 112. The waste heat utilization device 200 is connected to the immersed liquid cooling heat dissipation device 100. The waste heat utilization device 200 comprises a waste heat utilization body 210, a cold oil outlet 220 and a hot oil inlet 230. The cold oil outlet 220 and the hot oil inlet 230 are connected to the waste heat utilization body 210. Wherein, the cold oil outlet 220 on the waste heat utilization body 210 is connected to the oil tank inlet 111 of the liquid cooling tank 110, the oil tank outlet 112 of the liquid cooling tank 110 is connected to the hot oil inlet 230 on the waste heat utilization body 210, and the waste heat utilization body 210 is connected with a heat utilization end 300.

In the present invention, a plurality of computing devices 400 to be cooled, such as blockchain servers, are provided to be immersed in a cooling liquid in the liquid cooling tank 110, and the cooling liquid is circulated through the waste heat utilization device 200. That is, the cold cooling liquid is continuously input and the hot cooling liquid is drawn out, so as to dissipate heat for a plurality of computing devices 400 to be cooled disposed in the liquid cooling tank 110, and at the same time, the absorbed heat is provided to the heat utilization end 300, making full use of the waste heat and having a good economy. The heat utilization end 300 is, for example, various heating devices, such as a heat radiator device, a water heating device, and the like.

Wherein, the hot cooling liquid after absorbing the heat of the computing device to be cooled 400 flows out from the oil tank outlet 112 of the cooling tank 110 of the immersed liquid cooling heat dissipation device 100, and reaches to the waste heat utilization body 210 through the hot oil inlet 230 of the waste heat utilization device 200. The cold cooling liquid cooled by the heat exchange of the waste heat utilization body 210 flows out through the cold oil outlet 220, and enters into the cooling tank 110 through the oil tank inlet 111 of the immersed liquid cooling heat dissipation device 100, so as to circularly cool and dissipate the heat for the computing devices 400 to be cooled in the cooling tank 110, and at the same time exchanges heat to the heat utilization end 300 for use.

The waste heat utilization device 200 comprises a heat dissipation side circulation line 200a and a utilization side circulation line 200b. The heat dissipation side circulation line 200a is connected to the liquid cooling tank 110, and the utilization side circulation line 200b is connected to the heat utilization end 300.

In detail, the liquid cooling tank 110 comprises a first device tank compartment 110a, a second device tank compartment 110b, and a return tank compartment 110c. The first device tank compartment 110a and the second device tank compartment 110b are located on both sides of the return tank compartment 110c. In other words, the return tank compartment 110c is located between the first device tank compartment 110a and the second device tank compartment 110b. A plurality of computing devices 400 to be cooled are provided as immersed in the first device tank compartment 110a and the second device tank compartment 110b. The oil tank inlet 111 is disposed on the first device tank compartment 110a and the second device tank compartment 110b, and the oil tank outlet 112 is disposed on the return tank compartment 110c. The cold cooling liquid enters the first device tank compartment 110a and the second device tank compartment 110b from the oil tank inlet 111, and absorbs the heat dissipated from the computing devices 400 to be cooled in the first device tank compartment 110a and the second device tank compartment 110b compartment. The cooling liquid after absorbing the heat flows into the middle return tank compartment 110c, and enters the waste heat utilization body 210 through the circulation side line 200a.

Moreover, the liquid cooling tank 110 further comprises a return oil port 114, and the return oil port 114 is disposed on a wall surface between the first device tank compartment 110a and the return tank compartment 110c, and on a wall surface between the second device tank compartment 110b and the return tank compartment 110c. After absorbing heat, the cooling liquid in the first device tank compartment 110a flows back to the return tank compartment 110c from the return oil port 114 on the wall surface between the first device tank compartment 110a and the return tank compartment 110c, and after absorbing heat, the cooling liquid in the second device tank compartment 110b flows back to the return tank compartment 110c from the return oil port 114 on the wall surface between the second device tank compartment 110b and the return tank compartment 110c. Wherein, the height of the return oil port 114 is located at the highest liquid level of the computing devices 400 to be cooled.

In the present invention, the oil tank inlet 111 is lower than the computing devices 400 to be cooled, that is, the oil tank inlet 111 is disposed on the wall surface of the first device tank compartment 110a and the second device tank compartment 110b that is lower than the computing devices 400 to be cooled, such that the cooling liquid flows through the computing devices 400 to be cooled from bottom to top, so as to take away the working heat of the computing devices 400 to be cooled.

In the present embodiment, the waste heat utilization body 210 is a plate heat exchanger. Wherein, the cooling medium of the heat dissipation side circulation line 200a of the waste heat utilization device 200 is a cooling oil, and the cooling medium of the utilization side circulation line 200b is cooling water.

After cooling the computing devices 400 to be cooled, the cooling oil of the heat dissipation side circulation line 200a is transported by an oil pump to the plate heat exchanger through the hot oil inlet 230, and the cooling oil passes through the plate heat exchanger and then returns to the liquid cooling tank 110 through the cold oil outlet 220 to circularly cool the computing devices 400 to be cooled. In the utilization side circulation line 200b, after absorbing heat from the plate heat exchanger, the cooling water enters the heat utilization end 300, such as a terminal heat radiator for user, to dissipate heat, and then is transported to the plate heat exchanger by a water pump for circular heat exchange.

Figure 2:
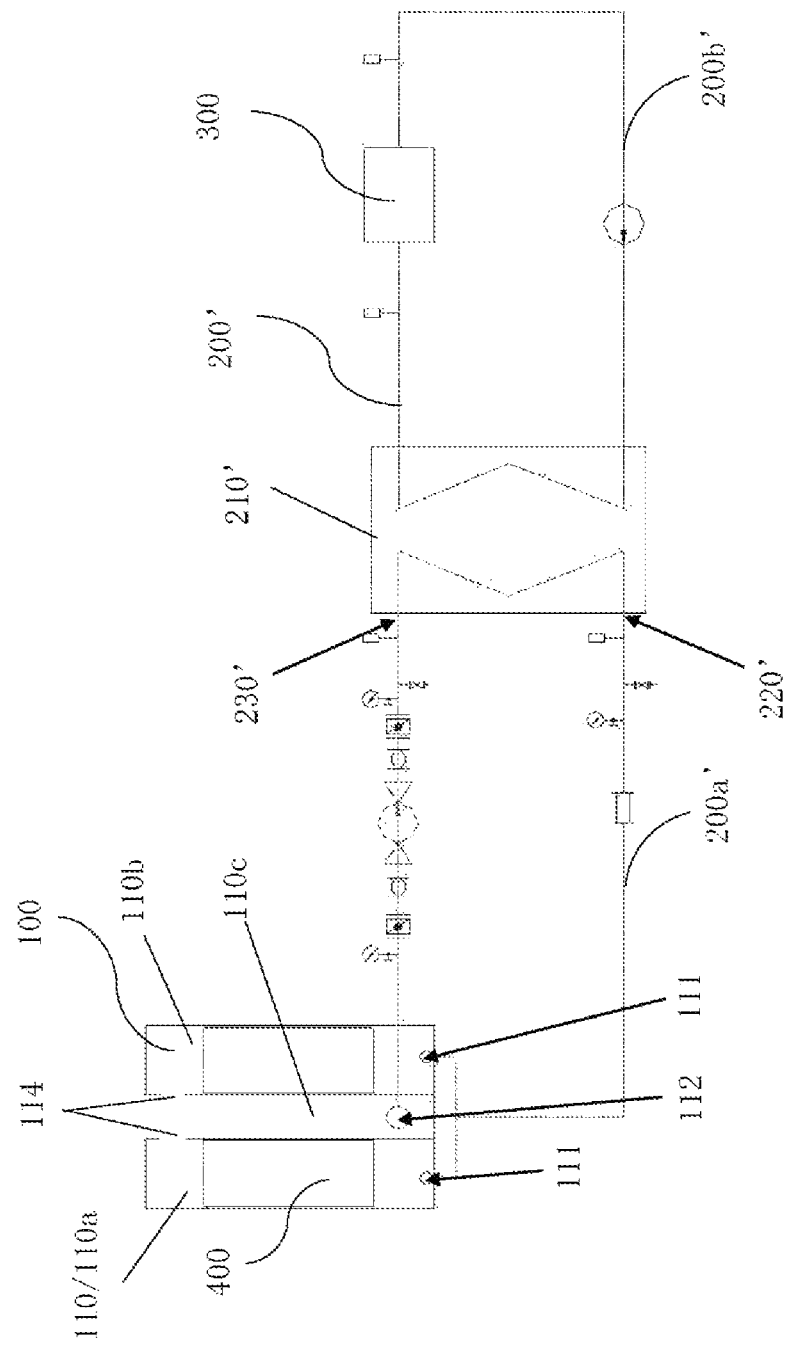
FIG. 2 is a structural schematic diagram (2) of an embodiment of the waste heat utilization system of the immersed liquid cooling heat dissipation device of the present invention.

As shown in FIG. 2, FIG. 2 is a structural schematic diagram of an embodiment of a waste heat utilization system of an immersed liquid cooling heat dissipation device of the present invention. It should be noted that, the embodiment in FIG. 2 follows the reference numbers and partial content of the embodiment in FIG. 1, wherein the same or similar numbers are used to denote the same or similar elements, and the description of the same technical content is omitted. For the description of the omitted content, reference may be made to the foregoing embodiment, and details thereof are not repeated here.

The difference of this embodiment from the previous embodiment is that the waste heat utilization body 210' is a finned tube heat exchanger. The cooling medium of the heat dissipation side circulation line 200a' of the waste heat utilization device 200' is a cooling oil, and the cooling medium of the utilization side circulation line 200b' is air.

After cooling the computing devices 400 to be cooled, the cooling oil of the heat dissipation side circulation line 200a' is transported by an oil pump to the finned tube heat exchanger through the hot oil inlet 230', and the cooling oil passes through the finned tube heat exchanger and then returns to the liquid cooling tank 110 through the cold oil outlet 220' to circularly cool the computing devices 400 to be cooled. In the utilization side circulation line 200b', after cooling the oil in the finned tube heat exchanger, the air provides heat to the heat utilization end 300, such as a terminal heat radiator for user, and then is driven and transported by a fan to the finned tube heat exchanger for circular heat exchange.

Figure 3:
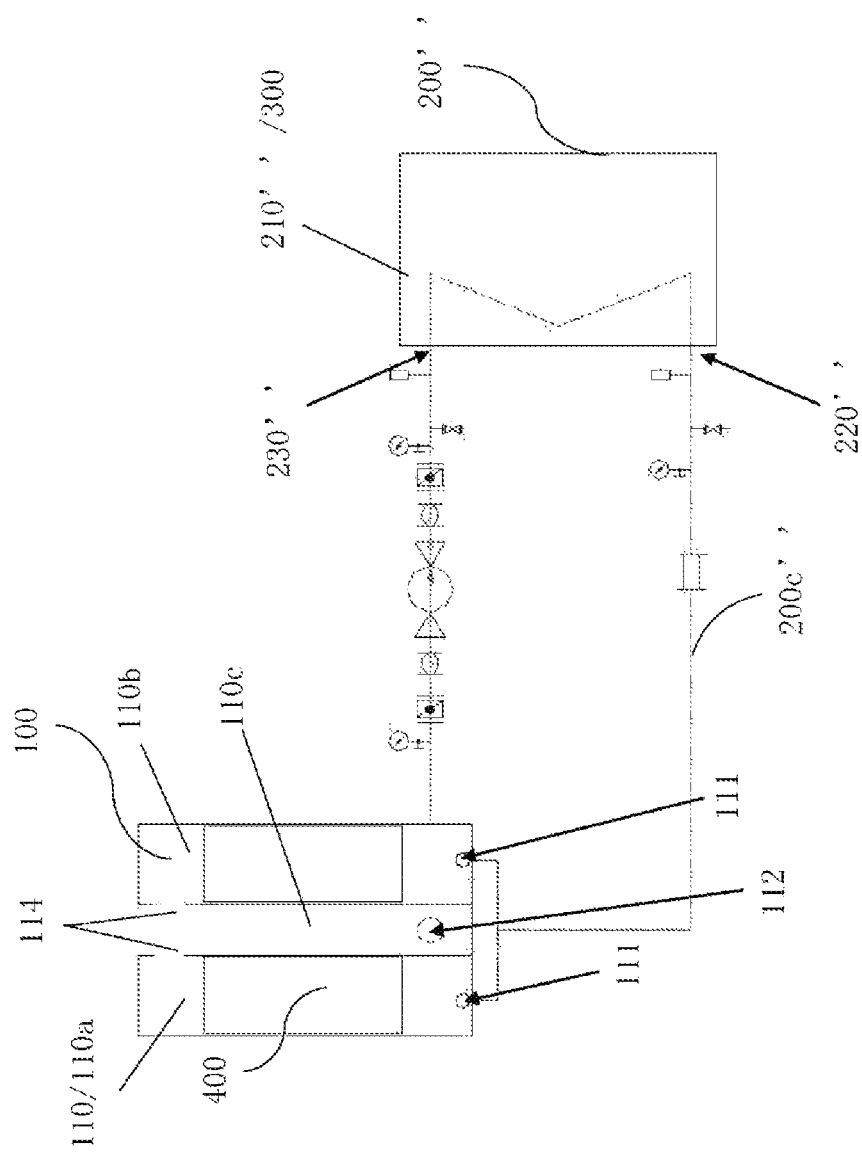
FIG. 3 is a structural schematic diagram (3) of an embodiment of the waste heat utilization system of the immersed liquid cooling heat dissipation device of the present invention.

As shown in FIG. 3, FIG. 3 is a structural schematic diagram of an embodiment of a waste heat utilization system of an immersed liquid cooling heat dissipation device of the present invention. It should be noted that, the embodiment in FIG. 3 follows the reference numbers and partial content of the embodiment in FIG. 1, wherein the same or similar numbers are used to denote the same or similar elements, and the description of the same technical content is omitted. For the description of the omitted content, reference may be made to the foregoing embodiment, and details thereof are not repeated here.

The difference of this embodiment from the previous embodiment is that the waste heat utilization device 200" comprises a circulation line 200c", and the heat utilization end 300 is connected in the circulation line 200c". After cooling the computing devices 400 to be cooled, the cooling oil in the circulation line 200c" is transported by an oil pump through the hot oil inlet 230" to the heat utilization end 300, such as a terminal heat radiator for user, to dissipate heat. After being cooled, the cooling oil passes through the cold oil outlet 220" and then return to the liquid cooling tank 110 to circularly cool the computing devices 400 to be cooled. In this embodiment, the heat utilization end 300 is the waste heat utilization body 210".

Of course, the present invention may also have other various embodiments, and without departing from the spirit and essence of the present invention, those skilled in the art can make various corresponding changes and variations according to the present invention, but these corresponding changes and variations should belong to the scope of the appended claims of the present invention.

INDUSTRIAL APPLICABILITY

In the waste heat utilization system of the immersed liquid cooling heat dissipation device of the present invention, the immersed liquid cooling heat dissipation device comprises a liquid cooling tank, and the liquid cooling tank comprises an oil tank inlet and an oil tank outlet, and the waste heat utilization system further comprises a waste heat utilization device, which comprises a waste heat utilization body and a cold oil outlet and a hot oil inlet connected to the waste heat utilization body. The cold oil outlet is connected to the oil tank inlet, the hot oil inlet is connected to the oil tank outlet, and the waste heat utilization body is connected with the heat utilization end. The optimization of computing device performance requires the support by more and more computing chips, and the use of a large number of computing chips greatly increases the heat dissipation. The immersed liquid cooling heat dissipation device has high heat dissipation efficiency. The waste heat utilization system of the immersed liquid cooling heat dissipation device of the present invention properly utilizes heat energy while performing liquid cooling heat dissipation.

What is claimed is:

1. A waste heat utilization system of an immersed liquid cooling heat dissipation device, the immersed liquid cooling heat dissipation device comprising:
    a liquid cooling tank, wherein the liquid cooling tank comprises an oil tank inlet and an oil tank outlet,
    characterized in that the waste heat utilization system further comprises a waste heat utilization device, wherein the waste heat utilization device comprises a waste heat utilization body, and a cold oil outlet and a hot oil inlet connected to the waste heat utilization body, wherein:
        the cold oil outlet is connected to the oil tank inlet, and cold cooling liquid flows out of the cold oil outlet and enters into the liquid cooling tank through the oil tank inlet,
        the hot oil inlet is connected to the oil tank outlet, and hot cooling liquid flows out of the oil tank outlet and enters the waste heat utilization device through the hot oil inlet, and
    the waste heat utilization body is connected with a heat utilization end.

2. The waste heat utilization system of the immersed liquid cooling heat dissipation device according to claim 1, characterized in that the waste heat utilization device comprises a heat dissipation side circulation line and a utilization side circulation line, the heat dissipation side circulation line being connected to the liquid cooling tank, and the utilization side circulation line being connected to the heat utilization end.

3. The waste heat utilization system of the immersed liquid cooling heat dissipation device according to claim 2, characterized in that the waste heat utilization body is a plate heat exchanger.

4. The waste heat utilization system of the immersed liquid cooling heat dissipation device according to claim 3, characterized in that a cooling medium of the heat dissipation side circulation line is cooling oil, and the cooling medium of the utilization side circulation line is cooling water.

5. The waste heat utilization system of the immersed liquid cooling heat dissipation device according to claim 2, characterized in that the waste heat utilization body is a finned tube heat exchanger.

6. The waste heat utilization system of the immersed liquid cooling heat dissipation device according to claim 5, characterized in that a cooling medium of the heat dissipation side circulation line is cooling oil, and a cooling medium of the utilization side circulation line is air.

7. The waste heat utilization system of the immersed liquid cooling heat dissipation device according to claim 1, characterized in that the waste heat utilization device comprises a circulation line, and the heat utilization end is connected in the circulation line.

8. The waste heat utilization system of the immersed liquid cooling heat dissipation device according to claim 1, characterized in that the liquid cooling tank comprises a first device tank compartment, a second device tank compartment and a return tank compartment, and the return tank compartment is located between the first device tank compartment and the second device tank compartment.

9. The waste heat utilization system of the immersed liquid cooling heat dissipation device according to claim 8, characterized in that the oil tank inlet is connected to the first device tank compartment and the second device tank compartment, the oil tank outlet is connected to the return tank compartment, and the oil tank inlet is lower than a computing device to be cooled disposed in the first device tank compartment and the second device tank compartment.

10. The waste heat utilization system of the immersed liquid cooling heat dissipation device according to claim 8, characterized in that the liquid cooling tank further comprises a plurality of return oil ports, and the return oil ports are disposed on wall surfaces between the first device tank compartment and the return tank compartment, and between the second device tank compartment and the return tank compartment.

* * * * *